United States Patent
Jain et al.

(10) Patent No.: US 7,392,021 B2
(45) Date of Patent: Jun. 24, 2008

(54) APPARATUS, SYSTEM, AND METHOD FOR MEASURING POWER DELIVERED TO A LOAD

(75) Inventors: Nitin Jain, San Diego, CA (US); Rajanish, La Mesa, CA (US); Angelos Alexanian, Somerville, MA (US)

(73) Assignee: M/A-Com, Inc., Lowell, MA (US)

( * ) Notice: Subject to any disclaimer, the term of this patent is extended or adjusted under 35 U.S.C. 154(b) by 506 days.

(21) Appl. No.: 11/196,371

(22) Filed: Aug. 3, 2005

(65) Prior Publication Data

US 2007/0032209 A1    Feb. 8, 2007

(51) Int. Cl.
*H03C 1/62* (2006.01)
*H04B 1/04* (2006.01)
*G01R 19/00* (2006.01)
*H03G 3/00* (2006.01)

(52) U.S. Cl. .................. 455/115.1; 455/126; 455/127.1; 330/2; 330/127

(58) Field of Classification Search .............. 455/115.1, 455/126, 127.1; 330/2, 127, 129, 290
See application file for complete search history.

(56) References Cited

U.S. PATENT DOCUMENTS

| | | | |
|---|---|---|---|
| 4,833,401 A * | 5/1989 | So ............................. | 324/142 |
| 5,056,109 A | 10/1991 | Gilhousen et al. | |
| 5,128,629 A * | 7/1992 | Trinh ......................... | 330/129 |
| 5,257,283 A | 10/1993 | Gilhousen et al. | |
| 5,265,119 A | 11/1993 | Gilhousen et al. | |
| 5,267,262 A | 11/1993 | Wheatley, III | |
| 5,396,516 A | 3/1995 | Padovani et al. | |
| 5,404,585 A * | 4/1995 | Vimpari et al. ............ | 455/115.1 |
| 5,434,537 A * | 7/1995 | Kukkonen ................. | 330/2 |
| 5,452,473 A | 9/1995 | Weiland et al. | |
| 5,485,486 A | 1/1996 | Gilhousen et al. | |
| 5,497,125 A * | 3/1996 | Royds ....................... | 330/290 |
| 5,590,408 A | 12/1996 | Weiland et al. | |
| 5,655,220 A | 8/1997 | Weiland et al. | |
| 5,661,434 A | 8/1997 | Brozovich et al. | |
| 5,703,902 A | 12/1997 | Ziv et al. | |
| 5,758,269 A | 5/1998 | Wu | |
| 5,903,554 A | 5/1999 | Saints | |
| 5,974,041 A | 10/1999 | Kornfeld et al. | |
| 6,075,974 A | 6/2000 | Saints et al. | |
| 6,122,180 A * | 9/2000 | Seo et al. ................. | 363/21.17 |
| 6,178,313 B1 | 1/2001 | Mages et al. | |
| 6,185,432 B1 | 2/2001 | Vembu | |
| 6,191,653 B1 | 2/2001 | Camp, Jr. et al. | |

(Continued)

*Primary Examiner*—Duc M. Nguyen

(57) ABSTRACT

Apparatus, system, and method including a circuit including an element having an electrical impedance, an input node to receive a signal, and an output node to couple to a load; a sensing circuit coupled to the input node and the output node to sense a differential voltage between the input and output nodes and to sense a detected voltage at the input node; and a multiplier circuit to receive the differential voltage and to receive the detected voltage. The multiplier circuit provides an output voltage proportional to the instantaneous power delivered to the load based on the differential voltage, the detected voltage, and the impedance of the element. A system may further include a radio frequency (RF) power amplifier (PA). A method may further include controlling a gain of the RF PA to maintain the power delivered to the load at a predetermined level based on the output voltage of the multiplier circuit.

24 Claims, 8 Drawing Sheets

U.S. PATENT DOCUMENTS

| | | |
|---|---|---|
| 6,194,963 B1 | 2/2001 | Camp, Jr. et al. |
| 6,259,928 B1 | 7/2001 | Vembu |
| 6,272,336 B1 | 8/2001 | Appel et al. |
| 6,289,205 B1 * | 9/2001 | Pollanen et al. ............. 455/126 |
| 6,320,913 B1 | 11/2001 | Nakayama |
| 6,330,462 B1 | 12/2001 | Chen |
| 6,351,650 B1 | 2/2002 | Lundby et al. |
| 6,370,109 B1 | 4/2002 | Schwartz et al. |
| 6,374,085 B1 | 4/2002 | Saints et al. |
| 6,421,327 B1 | 7/2002 | Lundby et al. |
| 6,490,460 B1 | 12/2002 | Soliman |
| 6,628,165 B1 | 9/2003 | Henderson et al. |
| 6,701,134 B1 | 3/2004 | Epperson |
| 7,288,991 B2 * | 10/2007 | Ripley ........................ 330/285 |
| 2003/0073419 A1 | 4/2003 | Chadwick |
| 2003/0223510 A1 | 12/2003 | Kurakami et al. |
| 2004/0192369 A1 | 9/2004 | Nilsson |
| 2005/0030104 A1 | 2/2005 | Chen et al. |

* cited by examiner

APPARATUS, SYSTEM, AND METHOD FOR MEASURING POWER DELIVERED TO A LOAD

BACKGROUND

In many radio frequency (RF) power amplifier (PA) circuit applications, (such as cellular telephone PAs), it may be desirable to measure the power delivered to the load (antenna) in real time. The power measurement may be used as feedback to adjust the amplifier bias point and/or gain to compensate for varying load and temperature conditions. It may be desirable to compensate a RF PA circuit to maintain a constant output power under varying conditions, such as varying load and temperature conditions, for example. Compensation may provide improved performance at the system level and may ensure compliance with FCC emission requirements, for example.

FIG. 1 illustrates a conventional coupler 100 used in a RF PA circuit for measuring power delivered to a load. Coupler 100 comprises an electrical circuit element 110 that is subject to incident power 116 and reflected power 118 between ports 112, 114. Coupler 100 also comprises a coupled line 120 to couple incident power 116 and reflected power 118 in circuit element 110 between coupled ports 126, 128 of coupler coupled line 120. Coupled line 120 exhibits backward coupling and may be terminated on one end by power detector 122 to measure coupled incident power 130 and may be terminated at another end by power detector 124 to measure coupled reflected power 132. Power delivered to circuit element 110 may be calculated by taking the difference between the coupled incident power 130 and the coupled reflected power 132.

In many applications, coupler 100 may be formed on a commercial circuit board such as a flame retardant 4 (FR4) printed circuit board. In such implementations, coupler 100 is usually large relative to the size of a typical PA circuit and therefore may add unnecessary cost to PA circuitry. The characteristics of coupler 100 may be frequency dependent, i.e., the amount of coupled incident power 130 and coupled reflected power 132 may depend on the coupler's electrical coupling length. Electrical losses of coupler 100 may be proportional to its electrical coupling length. Therefore, because coupler 100 may be long, its losses may be substantial. Accordingly, the performance of a conventional coupler may be frequency dependent due to its electrical coupling length. Those skilled in the art will appreciate that it is difficult to design a coupler with an octave bandwidth to minimize its electrical coupling length and hence to minimize its frequency dependency on its electrical coupling length. Those skilled in the art will appreciate that an octave spread covers a two to one frequency ratio, and accordingly, an octave bandwidth has an upper frequency of operation that is twice the lower frequency of operation. Therefore, in conventional power coupling implementations, coupler 100 requires substantial circuit board surface area, is difficult to design, is circuit specific, and its physical characteristics are substantially frequency dependent.

SUMMARY

One exemplary embodiment includes an apparatus, comprising a first circuit comprising a first element having an electrical impedance and having an input node to receive a signal and an output node to couple to a load; a sensing circuit coupled to the input node and the output node to sense a differential voltage between the input and output nodes and to sense a detected voltage at the input node; and a multiplier circuit to receive the differential voltage and to receive the detected voltage, the multiplier circuit to provide an output voltage proportional to an instantaneous power delivered to the load based on the differential voltage, the detected voltage, and the impedance of the first element of the first circuit. Other embodiments are described and claimed.

DETAILED DESCRIPTION

One embodiment of a circuit and technique for measuring power delivered to a load may comprise sensing RF voltage and RF current directly at or near a load, for example. The sensed RF current and voltage may be multiplied to produce an analog voltage that is proportional to the power delivered to the load. A multiplier circuit, such as for example, an analog active circuit may be used to perform multiplication of various input voltages and currents and produce an output voltage or current that is proportional to the product of the inputs. In one embodiment, an analog voltage output of a multiplier circuit may be used to control the gain of a RF PA to control the power delivered to a load and maintain the power delivered to the load at a desired level. For example, the analog voltage feedback provided by the multiplier circuit may be used to adjust the gain of the RF PA to maintain the power delivered to the load constant under varying loads and temperature conditions.

Figure 1:
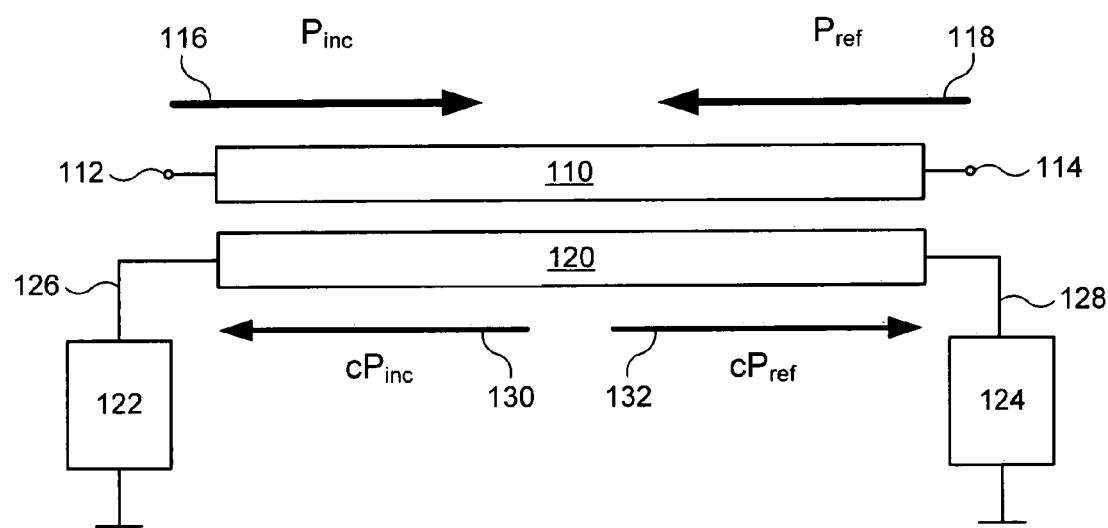
FIG. 1 illustrates a conventional coupler 100 used in radio frequency power amplifier circuits.

In one embodiment, a sensing circuit for sensing RF voltage and RF current may comprise an output matching network realized using lumped elements. These lumped elements may form a part of an output matching network or may be located external to it. In one embodiment, a sensing circuit comprising lumped elements may provide higher bandwidth characteristics, exhibit lower loss, and occupy less space than conventional coupler-based sensing circuits as discussed above with reference to FIG. 1, for example. In one embodiment, the sensing circuit may comprise a multiplication circuit coupled thereto. In one embodiment, the multiplication circuit may be coupled to the sensing circuit, but may be located external to the sensing circuit. In one embodiment, a voltage and current sensing circuit and a voltage/current multiplication circuit, or elements thereof, may be formed as an integrated circuit (IC) using semiconductor fabrication processes, for example. In one embodiment, the sensing circuit may be formed as an IC chip on a silicon substrate comprising RF complementary metal-oxide semiconductor (CMOS) technology. An IC based sensing and multiplication circuit is compact and provides an analog output voltage that is proportional to the power delivered to the load. Reducing the size of electronic components by employing IC techniques may be desirable in cellular telephone applications where physical space for housing electronic components is becoming increasingly smaller, for example.

Figure 2:
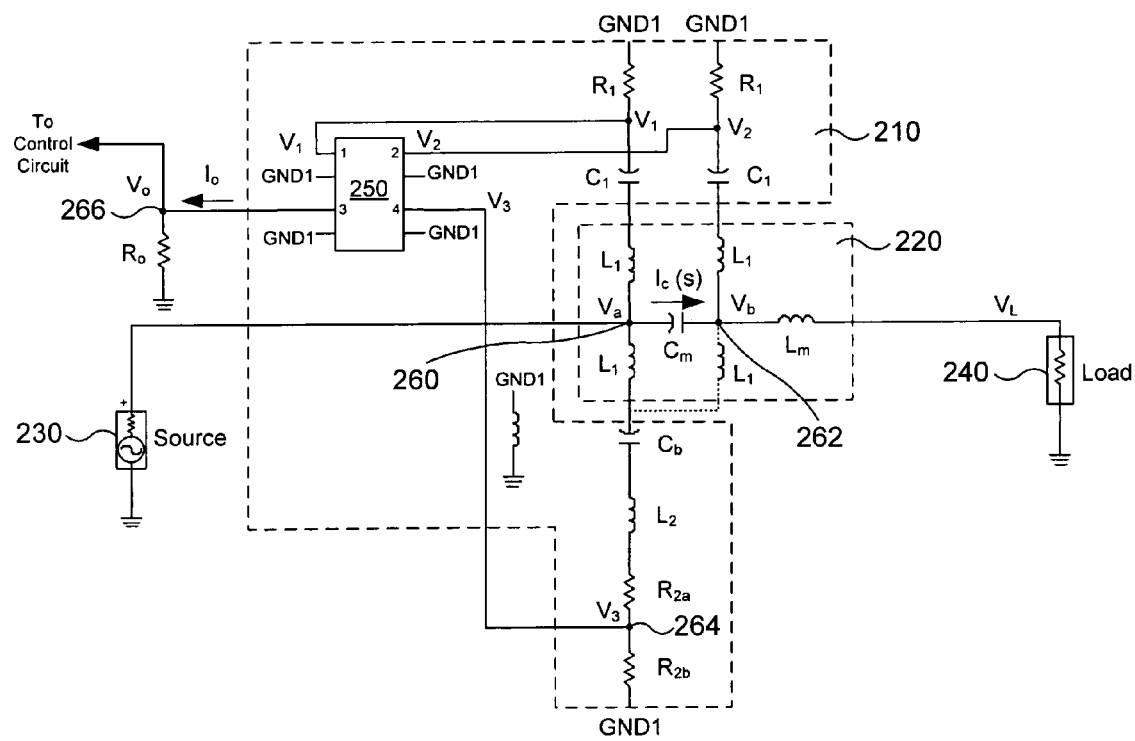
FIG. 2 illustrates one embodiment of a circuit 200.

FIG. 2 illustrates one embodiment of a circuit 200 arrangement to measure the actual power delivered to a load 240. Circuit 200 may comprise three portions: an amplifier depicted by source 230 portion; a matching network circuit 220 portion for the amplifier; and a RF voltage/current sensing circuit 210 portion. Amplifier depicted by source 230, illustrated generally as a signal source provides RF signals to matching network circuit 220 at input node 260. Circuit elements $C_m$ and $L_m$ may form a portion of matching circuit 220 for amplifier depicted by source 230. Circuit elements $C_m$ and $L_m$ may be blocking or matching capacitors and inductors, respectively. In one embodiment, circuit elements $C_m$ and $L_m$ may be any passive or active electrical or electronic element that can develop a voltage, which may be measured or calculated. Such elements may include resistors, capacitors, inductors, semiconductors, transistors, diodes, transmission lines, and the like. Elements $C_1$, $R_1$, $C_b$, $L_2$, $R_{2a}$, and $R_{2b}$ may form a portion of sensing circuit 210. In addition to circuit elements $C_1$, $R_1$, $C_b$, $L_2$, $R_{2a}$, and $R_{2b}$, sensing circuit 210 may comprise a multiplier circuit 250 coupled thereto, for example.

In one embodiment, matching network circuit 220 comprises inductance $L_1$ that may represent the inductance of bond-wires for making electrical connections between matching circuit 220 and sensing circuit 210. Although inductance $L_1$ is shown connected to node 260, in one embodiment, inductance $L_1$ may be connected to node 260 or node 262, for example. The value of inductance $L_1$ may vary in accordance with different embodiments. In one embodiment, for example, inductance $L_1$ may be assumed to be about 1 nH, for example. Nevertheless, inductance $L_1$ may be assumed to take nominal values with respect to the operation of sensing circuit 210 described herein. Also, for first order treatment, inductance $L_1$ and capacitance $C_b$ may be chosen such that their impedances are relatively small compared to the overall impedance of other electrical components of sensing circuit 210 and matching network circuit 220 at the operating frequency. In addition, in one embodiment it may be assumed that sensing circuit 210 does not load RF PA depicted by source 230 and matching circuit 220. Accordingly, in one embodiment it may be assumed that:

$$Z_1 = \frac{1}{\omega C_1} \gg 1 \qquad (1)$$
$$Z_2 = R_{2a} \gg 1$$

In one embodiment, multiplier circuit 250 may comprise four ports. Ports 1, 2, and 4 receive input voltages $V_1$, $V_2$, and $V_3$, respectively, and port 3 to drive output current $I_o$. Voltage $V_1$ is proportional to voltage $V_a$ at node 260. Voltage $V_2$ is proportional to voltage $V_b$ at node 262. Voltage $V_3$ at node 264 is proportional to voltage $V_a$ at node 260. Multiplier circuit 250 provides an output voltage $V_o$ that is the product of the differential voltage $(V_1-V_2)$ and a detected voltage $V_3$. Elements of matching circuit 220 and sensing circuit 210 may be selected to provide a phase matched relationship between differential voltage $(V_1-V_2)$ and detected voltage $V_3$ for a given frequency of the RF signal applied to node 260. Voltage $V_o$ is proportional to the power delivered to load 240. In one embodiment, the output of multiplier circuit 250 may be a current $I_o$. If output current $I_o$ is driven through resistor $R_o$, then voltage $V_o$ at node 266 may be the product of output current $I_o$ and resistor $R_o$. Voltage $V_o$ at node 266 may be provided to a control circuit (not shown) in a feedback loop to control the gain of RF PA depicted by source 230 in response to the power delivered to load 240. In one embodiment, multiplier circuit 250 may be a Gilbert cell multiplier, for example.

The following description of the operation of sensing circuit 210 for sensing RF voltage and current to calculate power delivered to load 240 may be simplified by assuming that multiplier circuit 250 is ideal. Those skilled in the art will appreciate that a real multiplier circuit may have limited dynamic range in part due to head room requirements (i.e., limited bias current supply) and electrical/electronic device mismatches. These limitations, however, generally are present in most power detection techniques, for example. Accordingly, the following description of sensing circuit 210 comprising an ideal multiplier 250 should not be considered to be a limitation to the scope of the embodiments described herein.

In operation, RF PA circuit depicted by source 230 amplifies RF signals. The RF signals are coupled to matching network 220 where voltages $V_a$ and $V_b$ develop across capacitor $C_m$ and produce capacitor current $I_c(s)$, which is represented in a Laplace transformed format. Those skilled in the art will appreciate that the Laplace transformed quantities described herein are representative of their instantaneous time domain representations, and vice versa. Current $I_c(s)$ may be coupled to load 240 by inductance $L_m$, for example. Power is delivered to load 240. Load voltage $V_L$ develops across load 240. The power delivered to load 240 may be calculated from load voltage $V_L$ and load current. The delivered power to the load also can be derived from voltages V1, V2, and V3 and the impedance of capacitor $C_m$ (e.g., $1/sC_m$). As previously discussed, voltages $V_1$ and $V_2$ are proportional to voltages $V_a$ and $V_b$, respectively. Voltage $V_3$ at node 264 is proportional to and may represent voltage $V_a$ at node 260. Voltage $V_3$ and the difference between $V_1$ and $V_2$ are provided to multiplier circuit 250. Voltage $V_1$ is provided to input 1 of multiplier circuit 250. Voltage $V_2$ is provided to input 2 of multiplier circuit 250. Voltage $V_3$ is provided to input 4 of multiplier circuit 250. Voltage $V_a$ at node 260 and voltage $V_b$ at node 262 are sampled. Current $I_c(s)$ may be determined based on the difference between sampled voltages $V_a$ and $V_b$ and the impedance of capacitor $C_m$. The output of multiplier 250 is representative of the power delivered to load 240 and may be derived from the differential voltage $(V_1-V_2)$ and the impedance of capacitor $C_m$, and voltage $V_3$, for example. The output of multiplier circuit 250 may be either a voltage or current $(V_o$ or $I_o)$ that is proportional to the power delivered to load 240.

Figure 3:
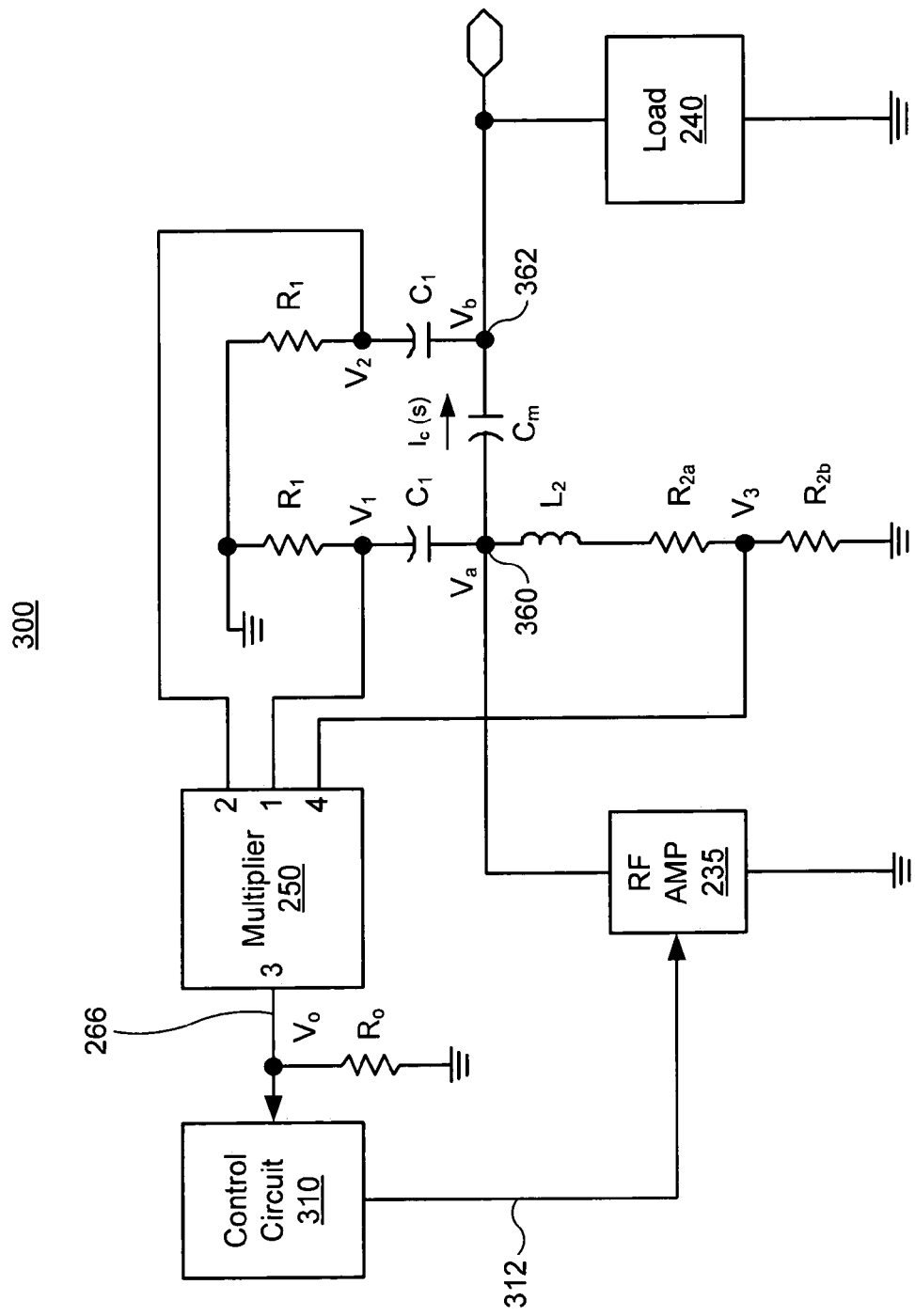
FIG. 3 illustrates one embodiment of a simplified equivalent circuit 300 of circuit 200.

FIG. 3 illustrates one embodiment of a circuit 300 arrangement to measure the actual power delivered to load 240 taking into consideration the assumptions discussed above (e.g., assuming inductance $L_1$ takes nominal values with respect to the operation of sensing circuit 210, sensing circuit 210 does not load RF PA depicted by source 230 and matching circuit 220, and that multiplier circuit 250 is ideal) in order to further simplify the description of the operation of circuit 200. Accordingly, circuit 300 may be analyzed as follows. Current $I_c(s)$ may be determined based on sampled voltages $V_a$ and $V_b$ and the impedance of capacitor $C_m$ as follows:

$$I_c(s) = (V_a(s) - V_b(s)) \cdot s \cdot C_m \qquad (2)$$

Similarly $(V_1-V_2)$ may be given by:

$$V_1(s) - V_2(s) = (V_a(s) - V_b(s)) \cdot \frac{s \cdot R_1 \cdot C_1}{1 + s \cdot R_1 \cdot C_1} \quad (3)$$

$V_3$ may be given by:

$$V_3(s) = V_a(s) \frac{R_{2b}}{R_{2b} + R_{2a} + s \cdot L_2} \quad (4)$$

Accordingly, the instantaneous power delivered to load 240 may be given by:

$$P_{del} = V_a(t) \cdot I_c(t) \quad (5)$$

where $V_a(t)$ and $I_c(t)$ are the inverse Laplace transforms of $V_a(s)$ and $I_c(s)$.

From equations (2) and (3):

$$V_1(s) - V_2(s) = \frac{\frac{R_1 \cdot C_1}{C_m} I_c(s)}{1 + s \cdot R_1 \cdot C_1} \quad (6)$$

$$V_3(s) = \frac{R_{2b}}{R_{2b} + R_{2a}} \frac{V_a(s)}{1 + \frac{s \cdot L_2}{R_{2b} + R_{2a}}}$$

As discussed previously, elements of matching circuit 220 and sensing circuit 210 may be selected to provide a phase matched relationship between differential voltage $(V_1-V_2)$ and detected voltage $V_3$ for a given frequency of the RF signal applied to node 360. Accordingly, to provide such phase matched relationship (or a matched time delay), in equations (6) elements of circuit 300 may be selected according to:

$$R_1 \cdot C_1 = \frac{L_2}{R_{2b} + R_{2a}} \quad (7)$$

or $$L_2 = R_1 \cdot C_1 \cdot (R_{2b} + R_{2a})$$

Then the phase of differential voltage $(V_1-V_2)$ and detected voltage $V_3$ are the same for a given frequency of the RF signal applied to node 360. Alternatively, except for a fixed phase change determined by $\omega RC_1$, the instantaneous power delivered to load 240, $P_{del}$, is given as below:

$$P_{del} = V_a(t) \cdot I_c(t) = A \cdot (V_1(t) - V_2(t)) \cdot V_3(t) \cdot (1 + \omega^2 \cdot R_1^2 \cdot C_1^2) \quad (8)$$

A is a scalar constant given by:

$$A = \frac{C_m}{R_1 \cdot C_1} \frac{R_{2b} + R_{2a}}{R_{2b}} \quad (9)$$

As previously discussed, in one embodiment multiplier circuit 250 may be implemented as a Gilbert cell multiplier. Accordingly, in one embodiment multiplication of differential voltage $(V_1-V_2)$ and detected voltage $V_3$ may be performed by multiplier circuit 250 implemented as a Gilbert cell type multiplier, for example. $V_1(t)$ and $V_2(t)$ are fed as differential signals to one arm of a Gilbert cell to inputs 1 and 2 of multiplier circuit 250 and $V_3(t)$ is fed as a detected signal to input 4 of multiplier circuit 250. Although the inputs to multiplier circuit 250 may comprise both even and odd modes of voltages $V_1(t)$, $V_2(t)$, and $V_3(t)$, the even mode is rejected by the common mode rejection ratio (CMRR) of multiplier circuit 250 and thus only the odd mode survives. Even and odd modes are the two main modes of propagation of a signal through a coupled transmission line pair. Odd mode voltage signals are propagated in a single transmission line when the two lines in a pair are driven differentially (e.g., with signals of the same amplitude and opposite polarity). Even mode voltage signals are propagated in a single transmission line when the two lines in a pair are driven with a common mode signal (e.g., the same amplitude and the same polarity). Multiplier circuit 250 in general takes V1, V2, and V3 voltages and multiplies them in a manner to obtain the instantaneous power. Whether the voltages at multiplier circuit 250 are odd-or-even mode is incidental. In one embodiment, multiplier circuit 250 may be a balanced line (odd mode) multiplier circuit, for example. In various embodiments, however, the voltages at multiplier circuit 150 may be single ended, for example. To make equation (8) frequency independent, the following additional constraint may be employed:

$$\omega \cdot R_1 \cdot C_1 \ll 1 \quad (10)$$

In one embodiment, the output $V_o$ of multiplier circuit 250 at node 266 may be provided to control circuit 310. Through connection 312, control circuit 310 provides gain adjustment to RF PA 235 (FIG. 3) based on the value of the output voltage $V_o$ from multiplier circuit 250. In one embodiment, the gain of RF PA 235 may be controlled by control circuit 310 based on the instantaneous power delivered to load 240, $P_{del}$. Accordingly, control circuit 310 controls the power delivered to load 240 to maintain it to a desired level. For example, the analog voltage feedback $V_o$ provided by multiplier circuit 250 may be used to adjust the gain of the RF PA 235 to maintain the power delivered to load 240 constant under varying loads and temperature conditions, for example.

The values for elements of circuit 300 may be determined in accordance with impedance characteristics of multiplier circuit 250. In one embodiment, $R_1$ and $R_{2b}$ may be determined by the loading impedance presented by multiplier circuit 250. For example, the impedance presented by a Gilbert cell type multiplier. In one embodiment, the value of $R_{2b}$ may be selected as 50 ohms, for example. $R_1$ also may be selected to be relatively low and will be determined hereinafter. In one embodiment, $R_1$ may be selected to be low enough such that the load of a transistor looks like an open circuit to it.

With reference now to FIGS. 2 and 3, as an example, the values for circuit elements of circuits 200, 300 may be derived for a RF PA used in global system for mobile communications (GSM) devices. Such GSM devices typically have an output peak power requirement of about 33 dBm and a dynamic range of power control of about 40 dB, for example. For a voltage standing wave ratio (VSWR) of 7:1 this may result in a large swing in voltage level. For example, in a 50 ohm environment, the voltage level may swing from 24.5V to 36 mV under worst case phase alignments and frequencies. This constitutes a range of 57 dB in the voltage, for example.

To achieve a desired voltage range, $R_{2b}/R_{2a}$ may be chosen such that $V_3$ is in the sub-volt to sub-millivolt range; alternatively $R_{2a} \gg R_{2b}$. At the same time $R_{2b}$ may be chosen to be high enough to provide minimum loading. For a maximum allowable loss of 0.06 dB, for example, $R_{2a}$ should be greater than 72×50 ohms (e.g., 3600 ohms) for example. If $R_{2a}$ is selected as 4000 ohms, then the coupled voltage $V_3$ would be in the desired millivolt range.

Similarly, $C_1$ may be selected to provide minimum loading and look like an open circuit over all transmit frequencies. For example, in one embodiment, $C_1$ may be selected to be 0.01 pF, which corresponds to 8000 ohms at 2 GHz. In one embodiment, $R_1$ may be selected in accordance with the voltage coupled to $V_1$ and $V_2$ and the impedance requirements of multiplier circuit 250, for example. In one embodiment, for matching circuit 220 with $C_m$ of 4 pF and series inductance $L_m$ of 2.8 nH, $R_1$ may be selected to be 100 ohms, for example. Accordingly, the selected value of $R_1$ of 100-ohms maintains the constraint in equation (10) valid. Once the values of the circuit elements are determined, the values of other elements of circuits 200, 300 may be determined as well. For example, based on the values selected above, $L_2$ calculates to 4.05 nH and A is 324 1/ohm.

In one embodiment, output capacitance $C_m$ may be wire-bonded from matching network circuit 220 to sensing circuit 210 through bond-wires. Bond-wires are typically 1 nH in value. Thus, as previously discussed inductance $L_1$ may be about 1 nH, for example. Therefore, the effective value of $L_2$ may be about 3.05 nH. Additionally, those skilled in the art will appreciate that other parasitic elements of circuits 200, 300 also may be included in various embodiments.

Figure 4:
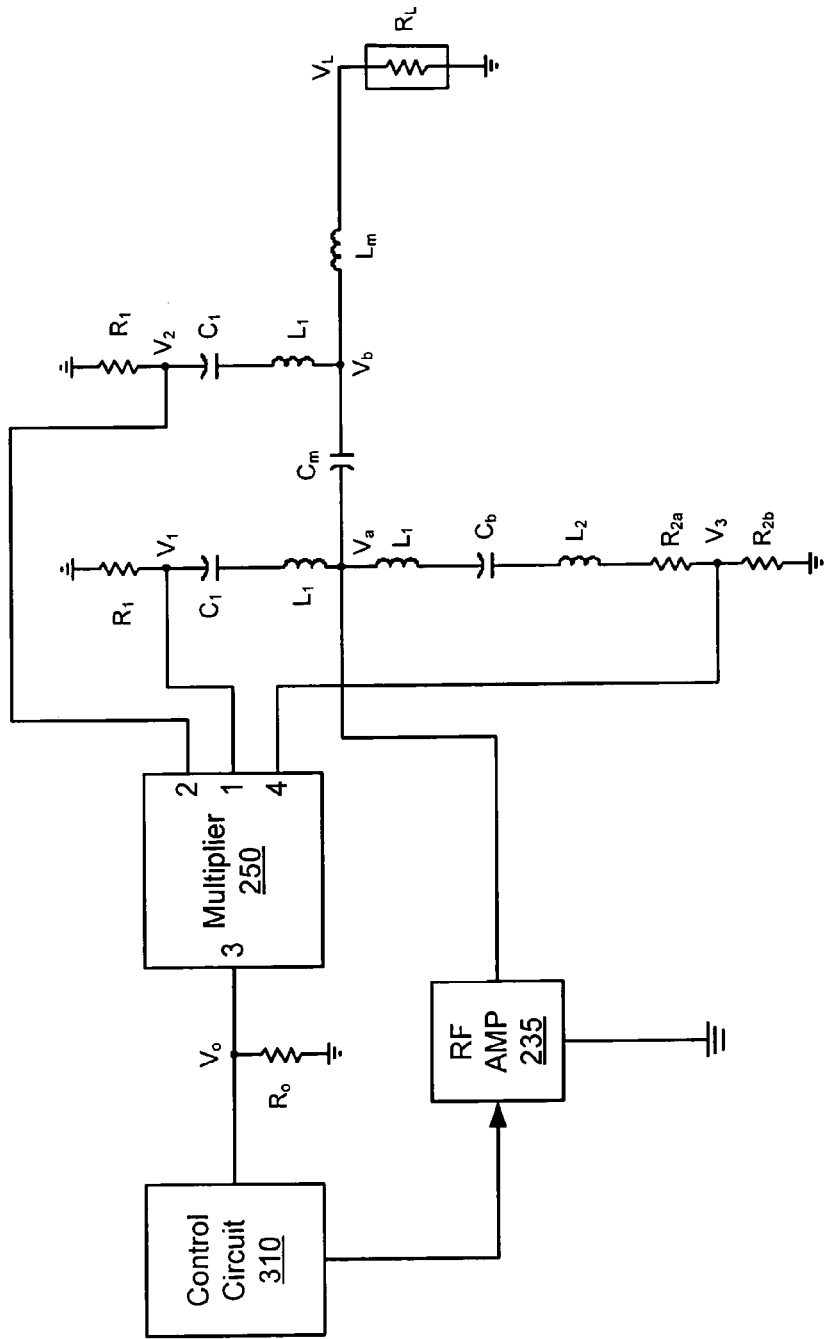
FIG. 4 illustrates one embodiment of a circuit 400.

FIG. 4 illustrates a circuit 400 for measuring power delivered to a load comprising derived values for the various electrical circuit elements. Circuit 400 is a combination of the embodiments of circuits 200 and 300 described above with respect to FIGS. 2 and 3, respectively. As with the example described above, the values for the circuit elements of circuit 400 may be selected for a RF PA used in GSM devices having an output peak power requirement of about 33 dBm and a dynamic range of power control of about 40 dB for a VSWR of 7:1. As previously described, in a 50 ohm environment, the voltage level may swing from 24.5 V to 36 mV under worst case phase alignments and frequencies and may constitute a range of 57 dB in the voltage, for example. In accordance with this example, the electrical component values of circuit 400 may be selected as shown in TABLE 1 below.

TABLE 1

| Electrical Element | Value |
|---|---|
| $R_1$ | 100 Ω |
| $R_{2a}$ | 4000 Ω |
| $R_{2b}$ | 50 Ω |
| $R_L$ | Zload Ω |
| $R_o$ | 50 Ω |
| $C_1$ | 0.01 pF |
| $C_m$ | 4 pF |
| $C_b$ | 40 pF |
| $L_1$ | 1 nH |
| $L_2$ | 4.05 nH |
| $L_m$ | 2.8 nH |

In accordance with the values in TABLE 1, one embodiment of circuit 400 was tested under a 7:1 VSWR at discrete frequencies of 1 GHz, 1.5 GHZ, and 2 GHz. The test results under these conditions, i.e., electrical component values and discrete frequencies discussed above, are described below with reference to FIG. 5.

Figure 5:
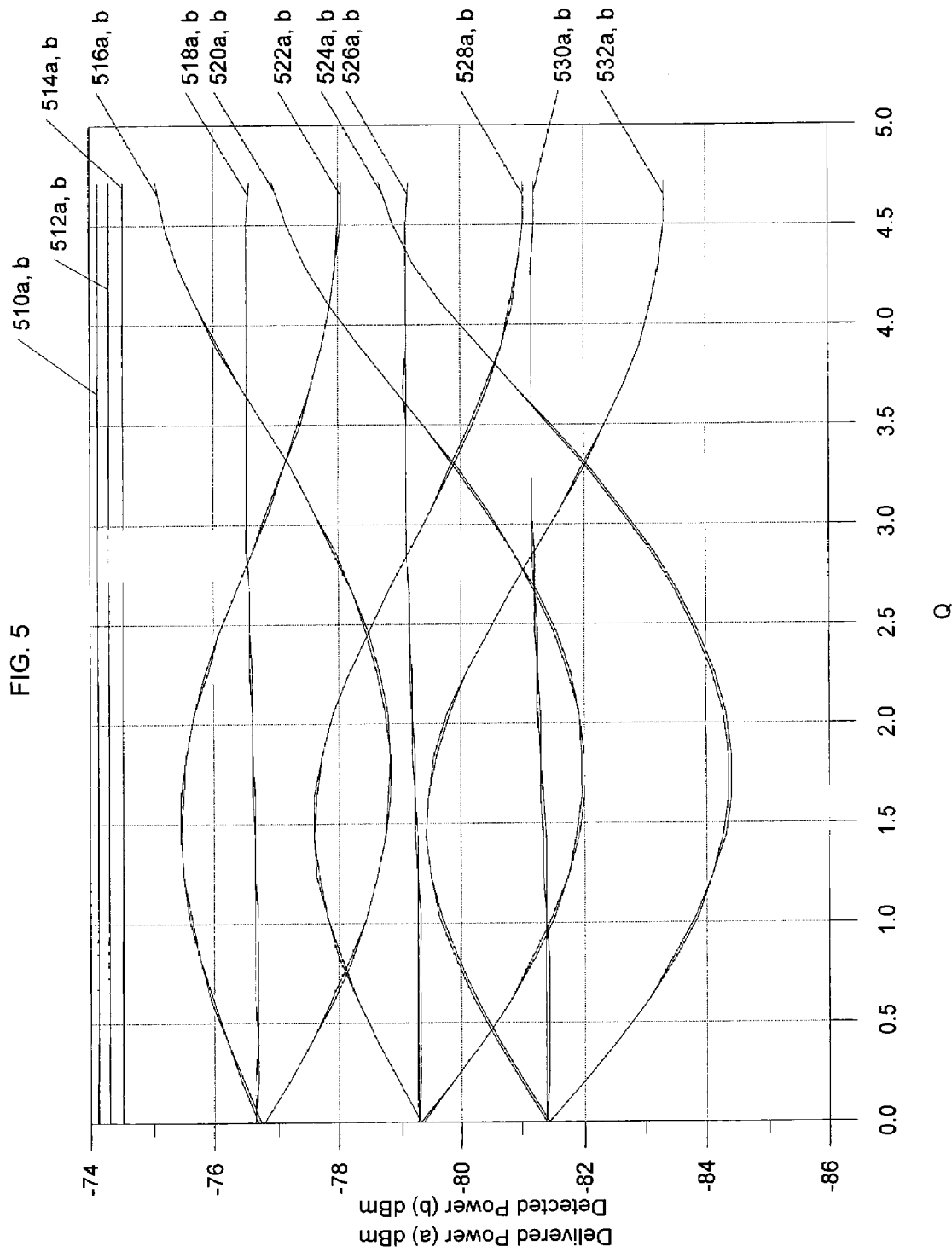
FIG. 5 is one embodiment of a graphical representation of delivered power $P_{del}$ together with detected power $P_{det}$ with respect to phase Q of the load.

FIG. 5 is one embodiment of a graphical representation of delivered power $P_{del}$ and detected power $P_{det}$ versus Q of sensing circuit 400 (FIG. 4). Where Q represents the phase of the reflection coefficient. The measurements were made for a VSWR of 1, 3, 5, and 7 and varying phase at output load $R_L$ for frequencies of 1 GHz, 1.5 GHz, and 2 GHz. Delivered power $P_{del}$ and detected power $P_{det}$ are shown along the vertical axis in decibels (dBm) and the Q is shown along the horizontal axis. The load $R_L$ is varied and the frequency is swept from 1 GHz, 1.5 GHz, and 2 GHz. As illustrated, the curves representing delivered power $P_{del}$ and detected power $P_{det}$ nearly overlap, indicating, for example, that the sensing circuit portion of circuit 400 (FIG. 4) substantially accurately detects the actual power delivered to load $R_L$.

A first set of curves graphically illustrates $P_{del}$ and $P_{det}$ for a VSWR of 1 and frequencies of 1.0 GHz, 1.5 GHz, and 2.0 GHz. Curves 510a, 512a, and 514a represent the delivered power $P_{del}$ for a VSWR of 1 and frequencies of 1.5 GHz, 2.0 GHz, and 1.0 GHz, respectively. Curves 510b, 512b, and 514b represent the detected power $P_{det}$ for a VSWR of 1 and frequencies of 1.5 GHz, 2.0 GHz, and 1.0 GHz, respectively. As shown, these curves are very nearly the same and are practically overlapped.

A second set of curves graphically illustrates $P_{del}$ and $P_{det}$ for a VSWR of 3 and frequencies of 1.0 GHz, 1.5 GHz, and 2.0 GHz. Curves 516a, 518a, and 522a represent the delivered power $P_{del}$ for VSWR=3 and frequencies of 1.0 GHz, 1.5 GHz, and 2.0 GHz, respectively. Curves 516b, 518b, and 522b represent the detected power $P_{det}$ for VSWR=3 and frequencies of 1.0 GHz, 1.5 GHz, and 2.0 GHz, respectively. As shown, these curves are very nearly the same and are practically overlapped.

A third set of curves graphically illustrates $P_{del}$ and $P_{det}$ for a VSWR of 5 and frequencies of 1.0 GHz, 1.5 GHz, and 2.0 GHz. Curves 520a, 526a, and 528a represent the delivered power $P_{del}$ for VSWR=5 and frequencies of 1.0 GHz, 1.5 GHz, and 2.0 GHz, respectively. Curves 520b, 526b, and 528b represent the detected power $P_{det}$ for VSWR=5 and frequencies of 1.0 GHz, 1.5 GHz, and 2.0 GHz, respectively. As shown, these curves are very nearly the same and are practically overlapped.

A fourth set of curves graphically illustrates $P_{del}$ and $P_{det}$ for a VSWR of 7 and frequencies of 1.0 GHz, 1.5 GHz, and 2.0 GHz. Curves 524a, 530a, and 532a represent the delivered power $P_{del}$ for VSWR=7 and frequencies of 1.0 GHz, 1.5 GHz, and 2.0 GHz, respectively. Curves 524b, 530b, and 532b represent the detected power $P_{det}$ for VSWR=7 and frequencies of 1.0 GHz, 1.5 GHz, and 2.0 GHz, respectively. As shown, these curves are very nearly the same and are practically overlapped.

Figure 6:
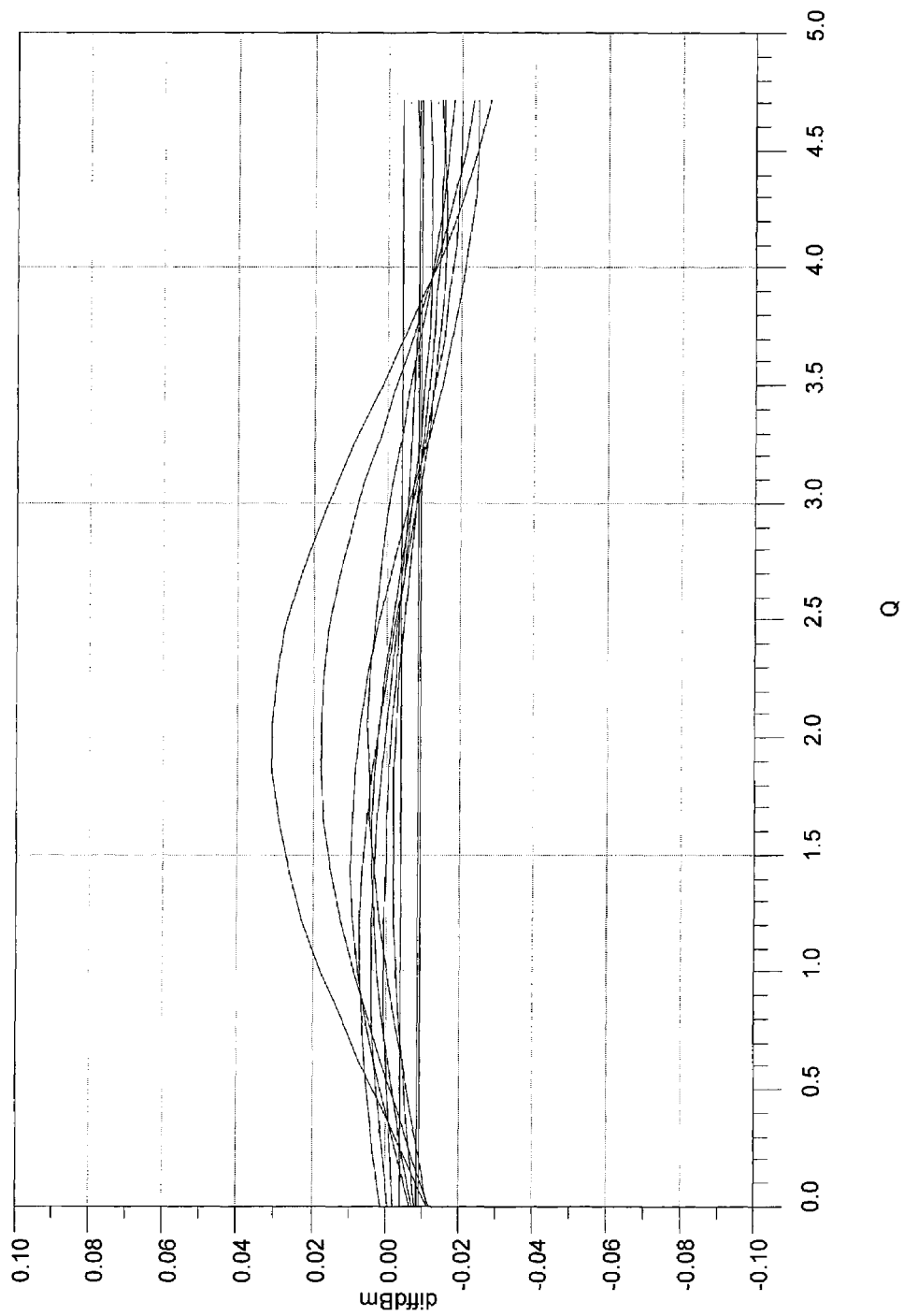
FIG. 6 is one embodiment of a graphical representation of the difference between detected power $P_{det}$ and delivered power $P_{del}$ with respect to phase Q of the load.

FIG. 6 is one embodiment of a graphical representation of the difference in decibels (dBm) along the vertical axis between detected power $P_{det}$ and delivered power $P_{del}$ with respect to Q shown along the horizontal axis, where Q represents the phase of the reflection coefficient. As illustrated, the detected voltage is within 0.05 dB of power delivered $P_{del}$ to load $R_L$ under various conditions. The loss under matched conditions may be in the order of about 0.055 dB, for example. Accordingly, in one embodiment circuit 400 (FIG. 4) provides a smaller compact circuit for measuring power delivered to a load as compared with conventional couplers (e.g., coupler illustrated in FIG. 1), is not frequency dependent, and has less than 0.06 dB loss.

Although specific embodiments for measuring power delivered to a load have been discussed, in addition to the circuits described above, there are various other embodiments that may be implemented to achieve the desired results in accordance with the principles discussed herein. For example, in one embodiment, sensed element $C_m$ may be replaced with an inductor or a transmission line or any electrical element capable of developing a voltage that may be calculated. Further, the voltage sensing circuits may be derived in various possible configurations. Those skilled in the art will appreciate that the above description is meant to encompass all such embodiments and configurations.

Figure 7:
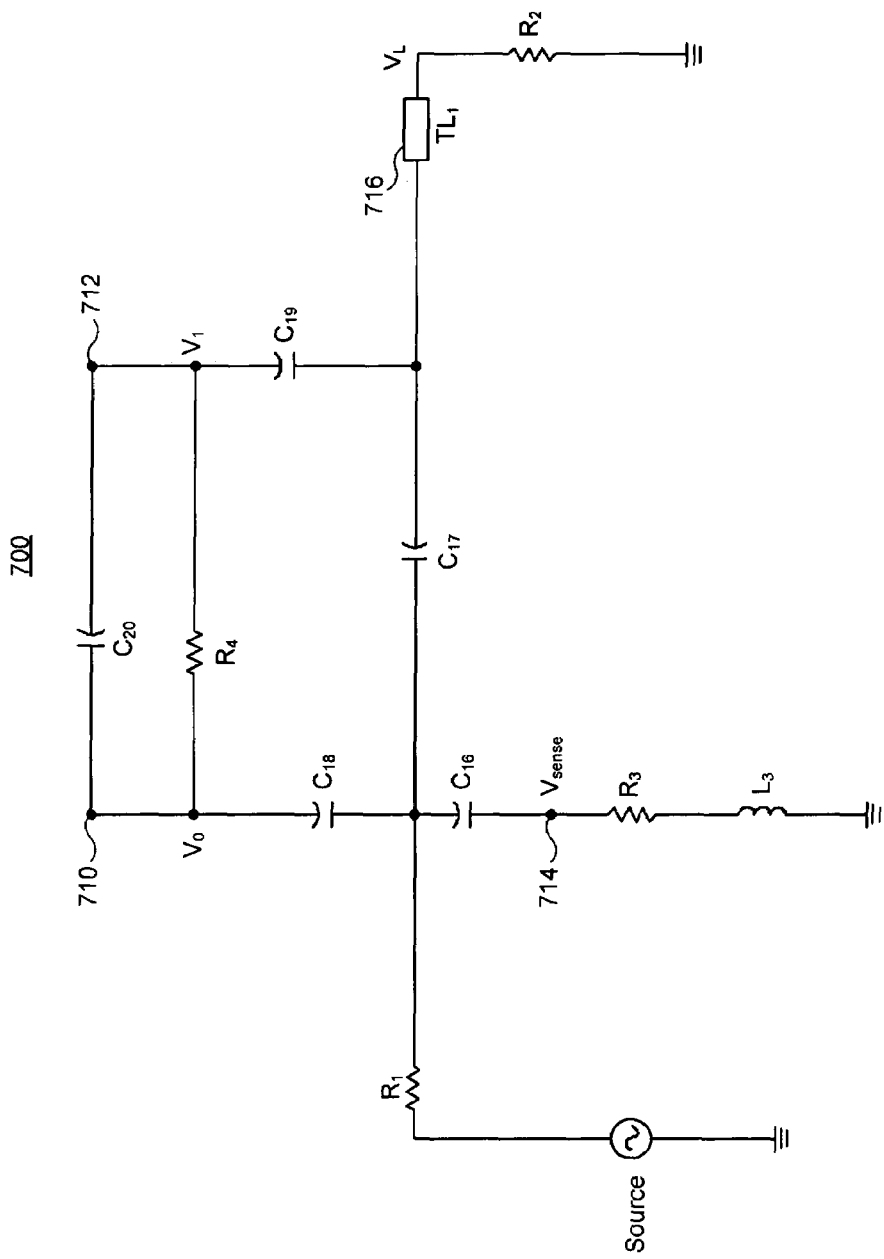
FIG. 7 illustrates one embodiment of a circuit 700.

FIG. 7 illustrates one embodiment of a circuit 700 for measuring power delivered to a load. Circuit 700 illustrates a schematic diagram of a circuit for measuring power delivered to a load with transmission line effects on sensed power $P_{det}$ under mismatched load conditions, for example. Circuit 700 comprises a transmission line 716 ($TL_1$) component in series with load $R_2$. In one embodiment, transmission line 716 has an impedance of 50 Ω. RF current is sensed between nodes 710, 712. The sensed RF current is proportional to $K*(V_1-V_0)$, for example, where K is a constant. The RF voltage is sensed at node 714.

Operations for the above system and subsystem may be further described with reference to the following figures and accompanying examples. Some of the figures may include programming logic. Although such figures presented herein may include a particular programming logic, it can be appreciated that the programming logic merely provides an example of how the general functionality described herein can be implemented. Further, the given programming logic does not necessarily have to be executed in the order presented unless otherwise indicated. In addition, the given programming logic may be implemented by a hardware element, a software element executed by a processor, or any combination thereof. The embodiments are not limited in this context.

Figure 8:
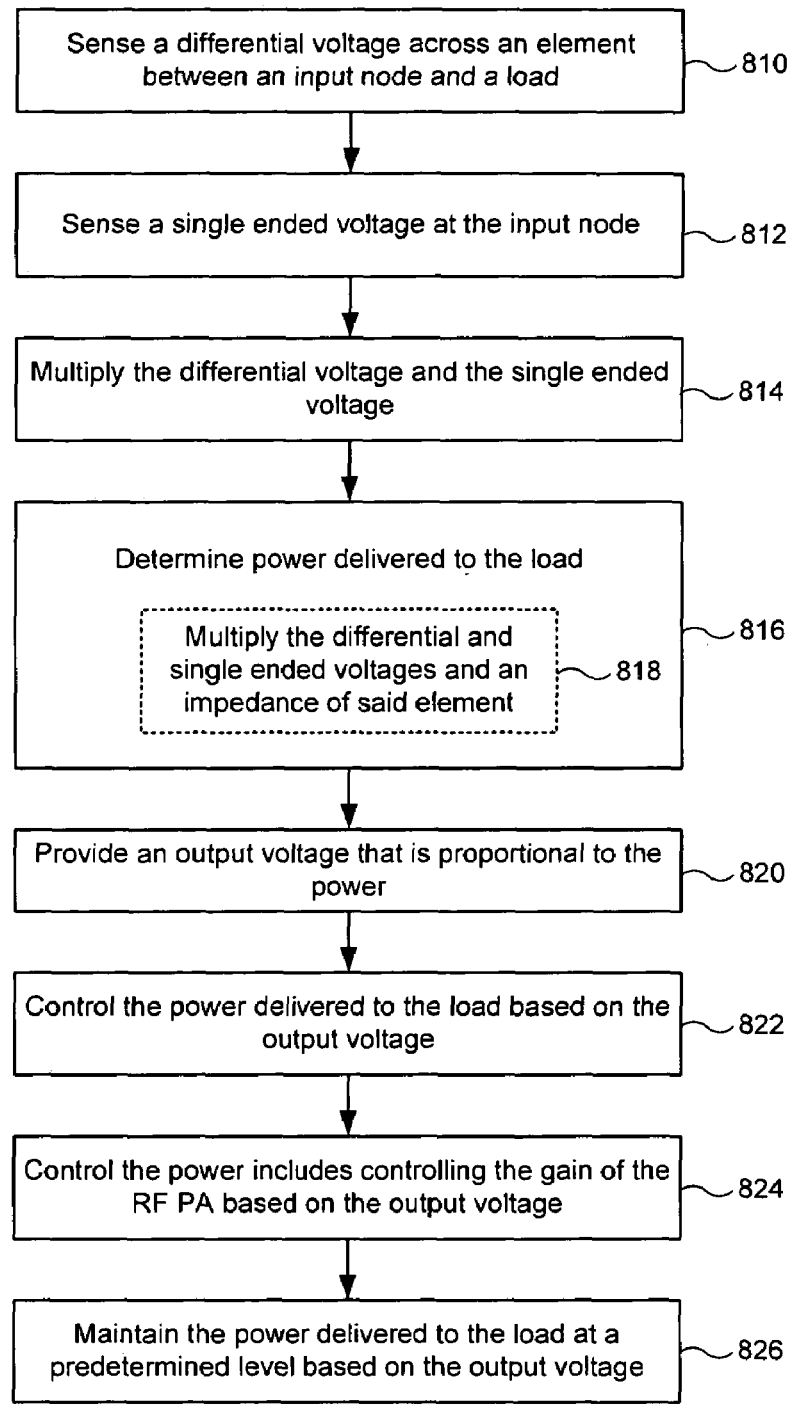
FIG. 8 illustrates one embodiment of a logic flow 800.

FIG. 8 illustrates one embodiment of a logic flow 800 to measure and control the power delivered to a load. In one embodiment, the logic flow 800 may be executed using the circuits shown in any of FIGS. 2, 3, 4, and 7.

Logic flow 800 senses a differential voltage across an element between an input node and a load (810), senses a detected voltage at the input node (812), multiplies the differential voltage and the detected voltage (814), determines power delivered to the load (816) by multiplying the differential and the detected voltages and an impedance of the element (818), and provides an output voltage that is proportional to the power (820).

In one embodiment, logic flow 800 controls the power delivered to the load based on the output voltage (822). In one embodiment, logic flow 800 controls the power includes controlling the gain of the RF PA based on the output voltage (824). In one embodiment, logic flow 800 maintains the power delivered to the load at a predetermined level based on the output voltage (826).

Numerous specific details have been set forth herein to provide a thorough understanding of the embodiments. It will be understood by those skilled in the art, however, that the embodiments may be practiced without these specific details. In other instances, well-known operations, components and circuits have not been described in detail so as not to obscure the embodiments. It can be appreciated that the specific structural and functional details disclosed herein may be representative and do not necessarily limit the scope of the embodiments.

It is also worthy to note that any reference to "one embodiment" or "an embodiment" means that a particular feature, structure, or characteristic described in connection with the embodiment is included in at least one embodiment. The appearances of the phrase "in one embodiment" in various places in the specification are not necessarily all referring to the same embodiment.

Some embodiments may be implemented using an architecture that may vary in accordance with any number of factors, such as desired speed, power levels, heat tolerances, semiconductor manufacturing processing, input rates, output rates, memory resources, and other performance constraints.

Some embodiments may be described using the expression "coupled" and "connected" along with their derivatives. It should be understood that these terms are not intended as synonyms for each other. For example, some embodiments may be described using the term "connected" to indicate that two or more elements are in direct physical or electrical contact with each other. In another example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

While certain features of the embodiments have been illustrated as described herein, many modifications, substitutions, changes and equivalents will now occur to those skilled in the art. It is therefore to be understood that the appended claims are intended to cover all such modifications and changes as fall within the true spirit of the embodiments.

The invention claimed is:

1. An apparatus, comprising:
   a first circuit comprising a first element having an electrical impedance and having an input node to receive a signal and an output node to couple to a load;
   a sensing circuit coupled to said input node and said output node to sense a differential voltage between said input and output nodes and to sense a detected voltage at said input node; and
   a multiplier circuit to receive said differential voltage and to receive said detected voltage, said multiplier circuit to provide an output voltage proportional to an instantaneous power delivered to said load based on said differential voltage, said detected voltage, and said impedance of said first element of said first circuit.

2. The apparatus of claim 1, wherein said first element of said first circuit is selected from the group consisting of a resistor, capacitor, inductor, semiconductor, transistor, diode, and transmission line.

3. The apparatus of claim 1, wherein said sensing circuit comprises:
   a first element coupled to said input node;
   a second element coupled to said output node;
   a third element coupled to said input node;
   wherein said first, second, and third elements of said sensing circuit have an impedance selected to prevent said sensing circuit from loading said signal.

4. The apparatus of claim 3, wherein the impedance of said first element of said first circuit and the impedance of said first element of said sensing circuit is selected to prevent said sensing circuit from loading said signal.

5. The apparatus of claim 3, wherein said first element of said first circuit and said first, second, and third elements of said sensing circuit are selected to provide a phase matched relationship between said differential voltage and said detected voltage for a given frequency of said signal.

6. The apparatus of claim 5, wherein:
   said first element of said first circuit comprises a capacitor ($C_m$);
   said first element of said sensing circuit comprises an inductor ($L_2$), a first resistor ($R_{2a}$), and a second resistor ($R_{2b}$) connected in series therewith; and
   said second and third elements of said sensing circuit each comprise a resistor ($R_1$) and a capacitor ($C_1$) connected in series therewith.

7. The apparatus of claim 6, wherein said differential voltage and said detected voltage are determined from the relationships, which are represented in a Laplace transformed format:

$$V_1(s) - V_2(s) = \frac{\frac{R_1 \cdot C_1}{C_m} I_c(s)}{1 + s \cdot R_1 \cdot C_1};$$

and $$V_3(s) = \frac{R_{2b}}{R_{2b} + R_{2a}} \frac{V_a(s)}{1 + \frac{s \cdot L_2}{R_{2b} + R_{2a}}}$$

wherein $V_1(s)-V_2(s)$ is said differential voltage;
wherein $V_3(s)$ is said detected voltage;
wherein $I_c(s)$ is the Laplace transform of the instantaneous current ($I_c(t)$) through capacitor $C_m$;
wherein $V_a(s)$ is the Laplace transform of the instantaneous signal voltage ($V_a(t)$) at said input node; and
wherein $V_1(s)-V_2(s)$ and $V_3(s)$ are the Laplace transforms of the instantaneous differential voltage $V_1(t)-V_2(t)$ and the instantaneous detected voltage $V_3(t)$.

8. The apparatus of claim 6, wherein said first, second, and third elements of said sensing circuit are determined by the relationship:

$$R_1 \cdot C_1 = \frac{L_2}{R_{2b} + R_{2a}}.$$

9. The apparatus of claim 6, wherein instantaneous power delivered to said load ($P_{del}$) is determined by the relationship:

$$P_{del} = V_a(t) \cdot I_c(t) = A \cdot (V_1(t) - V_2(t)) \cdot V_3(t) \cdot (1 + \omega^2 \cdot R_1^2 \cdot C_1^2)$$

wherein $V_a(t)$ is the instantaneous signal voltage at said input node;
wherein $I_c(t)$ is the instantaneous current through said capacitor $C_m$;
wherein $V_1(t)-V_2(t)$ is the instantaneous differential voltage sensed by said sensing circuit;
wherein $V_3(t)$ is the instantaneous detected voltage sensed by said sensing circuit;
wherein $\omega$ is the radian frequency of said signal; and
wherein A is determined by the relationship:

$$A = \frac{C_m}{R_1 \cdot C_1} \frac{R_{2b} + R_{2a}}{R_{2b}}.$$

10. The apparatus of claim 1, comprising:
a control circuit coupled to said multiplier circuit and to a radio frequency (RF) power amplifier (PA), said control circuit to receive said output voltage from said multiplier circuit and to adjust the gain of said RF PA to maintain said power delivered to said load to a predetermined value.

11. A system, comprising:
a radio frequency (RF) power amplifier (PA); and
a circuit, wherein said circuit comprises:
a first circuit comprising a first element having an electrical impedance and having an input node to receive a signal and an output node to couple to a load;
a sensing circuit coupled to said input node and said output node to sense a differential voltage between said input and output nodes and to sense a detected voltage at said input node; and
a multiplier circuit to receive said differential voltage and to receive said detected voltage, said multiplier circuit to provide an output voltage proportional to an instantaneous power delivered to said load based on said differential voltage, said detected voltage, and said impedance of said first element of said first circuit.

12. The system of claim 11, wherein said first element of said first circuit is selected from the group consisting of a resistor, capacitor, inductor, semiconductor, transistor, diode, and transmission line.

13. The system of claim 11, wherein said sensing circuit comprises:
a first element coupled to said input node;
a second element coupled to said output node;
a third element coupled to said input node;
wherein said first, second, and third elements of said sensing circuit have an impedance selected to prevent said sensing circuit from loading said signal.

14. The system of claim 13, wherein the impedance of said first element of said first circuit and the impedance of said first element of said sensing circuit is selected to prevent said sensing circuit from loading said RF PA.

15. The system of claim 13, wherein said first element of said first circuit and said first, second, and third elements of said sensing circuits are selected to provide a phase matched relationship between said differential voltage and said detected voltage for a given frequency of said signal.

16. The system of claim 15, wherein:
said first element of said first circuit comprises a capacitor ($C_m$);
said first element of said sensing circuit comprises an inductor ($L_2$), a first resistor ($R_{2a}$), and a second resistor ($R_{2b}$) connected in series therewith; and
said second and third elements of said sensing circuit each comprise a resistor ($R_1$) and a capacitor ($C_1$) connected in series therewith.

17. The system of claim 16, wherein said differential voltage and said detected voltage are determined from the relationships, which are represented in a Laplace transformed format:

$$V_1(s) - V_2(s) = \frac{\frac{R_1 \cdot C_1}{C_m} I_c(s)}{1 + s \cdot R_1 \cdot C_1};$$

and $$V_3(s) = \frac{R_{2b}}{R_{2b} + R_{2a}} \frac{V_a(s)}{1 + \frac{s \cdot L_2}{R_{2b} + R_{2a}}}.$$

wherein $V_1(s)-V_2(s)$ is said differential voltage;
wherein $V_3(s)$ is said detected voltage;
wherein $I_c(s)$ is the Laplace transform of the instantaneous current ($I_c(t)$) through capacitor $C_m$;
wherein $V_a(s)$ is the Laplace transform of the instantaneous signal voltage ($V_a(t)$) at said input node; and
wherein $V_1(s)-V_2(s)$ and $V_3(s)$ are the Laplace transforms of the instantaneous differential voltage $V_1(t)-V_2(t)$ and the instantaneous detected voltage $V_3(t)$.

18. The system of claim 16, wherein said first, second, and third elements of said sensing circuit are determined by the relationship:

$$R_1 \cdot C_1 = \frac{L_2}{R_{2b} + R_{2a}}.$$

19. The system of claim 16, wherein instantaneous power delivered to said load ($P_{del}$) is determined by the relationship:

$$P_{del}=V_a(t) \cdot I_c(t) = A \cdot (V_1(t)-V_2(t)) \cdot V_3(t) \cdot (1+\omega^2 \cdot R_1^2 \cdot C_1^2)$$

wherein $V_a(t)$ is the instantaneous signal voltage at said input node;
wherein $I_c(t)$ is the instantaneous current through said capacitor $C_m$;
wherein $V_1(t)-V_2(t)$ is the instantaneous differential voltage sensed by said sensing circuit;
wherein $V_3(t)$ is the instantaneous detected voltage sensed by said sensing circuit;
wherein $\omega$ is the radian frequency of said signal; and
wherein A is determined by the relationship:

$$A = \frac{C_m}{R_1 \cdot C_1} \frac{R_{2b}+R_{2a}}{R_{2b}}.$$

20. The system of claim 11, comprising:
a control circuit coupled to said multiplier circuit and to a radio frequency (RF) power amplifier (PA), said control circuit to receive said output voltage from said multiplier circuit and to adjust the gain of said RF PA to maintain said power delivered to said load to a predetermined value.

21. A method, comprising:
sensing a differential voltage across an element between an input node and a load;
sensing a detected voltage at said input node;
multiplying said differential voltage and said detected voltage;
determining power delivered to said load based on said multiplied differential and detected voltages and an impedance of said element; and
providing an output voltage that is proportional to said power.

22. The method of claim 21, comprising controlling power delivered to said load based on said output voltage.

23. The method of claim 22, wherein controlling said power comprises controlling a gain of a radio frequency (RF) power amplifier (PA) based on said output voltage.

24. The method of claim 22, comprising maintaining said power delivered to said load at a predetermined level based on said output voltage.

* * * * *